(12) United States Patent
Ko et al.

(10) Patent No.: US 10,778,919 B2
(45) Date of Patent: Sep. 15, 2020

(54) IMAGE SENSOR

(71) Applicant: SAMSUNG ELECTRONICS CO., LTD., Suwon-si, Gyeonggi-Do (KR)

(72) Inventors: Ju Hyun Ko, Hwaseong-si (KR); Kyu Ik Cho, Hwaseong-si (KR); Jin Young Jeong, Seoul (KR); Dong Jae Han, Seoul (KR); Seok Yong Hong, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 154 days.

(21) Appl. No.: 15/873,344

(22) Filed: Jan. 17, 2018

(65) Prior Publication Data

US 2018/0205903 A1    Jul. 19, 2018

(30) Foreign Application Priority Data

Jan. 18, 2017 (KR) .................. 10-2017-0008770
Dec. 26, 2017 (KR) .................. 10-2017-0179262

(51) Int. Cl.
| | | |
|---|---|---|
| *H04N 5/3745* | (2011.01) | |
| *H04N 5/361* | (2011.01) | |
| *H04N 5/378* | (2011.01) | |
| *H01L 27/148* | (2006.01) | |
| *H01L 27/146* | (2006.01) | |
| *H04N 5/369* | (2011.01) | |

(52) U.S. Cl.
CPC ..... *H04N 5/3745* (2013.01); *H01L 27/14605* (2013.01); *H01L 27/14806* (2013.01); *H04N 5/361* (2013.01); *H04N 5/3698* (2013.01); *H04N 5/378* (2013.01); *H04N 5/37455* (2013.01)

(58) Field of Classification Search
CPC ...... H04N 5/361; H04N 5/378; H04N 5/3698; H04N 5/3745–37455; H04N 5/3355; H04N 5/357–3675; H01L 27/14806; H01L 27/14605
USPC ................... 348/308; 341/155–172
See application file for complete search history.

(56) References Cited

U.S. PATENT DOCUMENTS

| | | | |
|---|---|---|---|
| 2007/0029467 A1* | 2/2007 | Lee ...................... | H03M 1/0845 250/208.1 |
| 2012/0120300 A1 | 5/2012 | Dai | |
| 2016/0028974 A1* | 1/2016 | Guidash ............. | H04N 5/37455 348/294 |

* cited by examiner

*Primary Examiner* — Xi Wang
(74) *Attorney, Agent, or Firm* — F. Chau & Associates, LLC

(57) ABSTRACT

An image sensor is provided. The image sensor includes a pixel array including first and second pixels, the first and second pixels receiving the same transfer gate signal and outputting first and second signal voltages, respectively, a transfer gate driver receiving first and second voltages and generating the transfer gate signal, the transfer gate signal having the first voltage as its maximum voltage and having the second voltage as its minimum voltage and a compensation module detecting a variation in the second voltage, generating a compensation voltage based on the variation in the second voltage, and performing a compensation operation.

18 Claims, 13 Drawing Sheets

IMAGE SENSOR

CROSS-REFERENCE TO RELATED APPLICATION

This application claims priority to Korean provisional Patent Application No. 10-2017-0008770, filed on Jan. 18, 2017, and Korean non-provisional Patent Application No. 10-2017-0179262, filed on Dec. 26, 2017 and all the benefits accruing therefrom under 35 U.S.C. § 119, the disclosure of which is incorporated by reference in its entirety.

TECHNICAL FIELD

The present disclosure relates to an image sensor.

DISCUSSION OF RELATED ART

An image sensor is a type of device that converts an optical image into electrical signals. The image sensor can be classified into a charge-coupled device (CCD) type and a complementary metal oxide semiconductor (CMOS) type. A CMOS image sensor, abbreviated as a CIS, includes a plurality of pixels arranged in a two-dimensional matrix. Each of the pixels includes a photodiode (PD). The PD converts incident light into an electrical signal.

With recent developments in the computer industry and the communications industry, the demand for image sensors has increased in various fields, such as, the fields of digital cameras, camcorders, personal communication systems (PCSs), game devices, surveillance cameras, medical micro cameras, and robots. In addition, as semiconductor devices are highly integrated, image sensors are also highly integrated.

SUMMARY

Exemplary embodiments of the present disclosure provide an image sensor capable of improving its operating characteristics, such as, reducing or eliminating a band noise phenomenon.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, there is provided an image sensor comprising a pixel array including first and second pixels, the first and second pixels receiving the same transfer gate signal and outputting first and second signal voltages, respectively, a transfer gate driver receiving first and second voltages and generating the transfer gate signal, the transfer gate signal having the first voltage as its maximum voltage and having the second voltage as its minimum voltage and a compensation module detecting a variation in the second voltage, generating a compensation voltage based on the variation in the second voltage, and performing a compensation operation.

According to the aforementioned and other exemplary embodiments of the present disclosure, there is provided an image sensor comprising a pixel array including first and second pixels the belong to the same row, the first and second pixels outputting first and second signal voltages, respectively, a bias circuit connected to the pixel array and inducing the first and second signal voltages, a transfer gate driver generating a transfer gate signal based on first and second voltages and providing the transfer gate signal to the first and second pixels, the transfer gate signal having the first voltage as its maximum voltage and having the second voltage as its minimum voltage, a ramp voltage generation module generating a ramp voltage, a compensation module generating a compensation voltage in accordance with a variation in the second voltage and performing a compensation operation and an output module generating a first digital code based on the ramp voltage and the first signal voltage and generating a second digital code based on the ramp voltage and the second signal voltage.

According to the aforementioned and other exemplary embodiments of the present disclosure, there is provided an image sensor comprising a photoelectric element accumulating charges therein by absorbing incident light, a transfer transistor transferring the charges to a floating diffusion region in accordance with a transfer gate signal, a source follower outputting a voltage of the floating diffusion region as a signal voltage, a transfer gate driver applying the transfer gate signal to the transfer transistor, a compensation module generating a compensation voltage by detecting a variation in the transfer gate signal, and performing a compensation operation using the compensation voltage and au output module comparing the ramp voltage and the signal voltage and outputting a digital code.

According to the aforementioned and other exemplary embodiments of the present disclosure, there is provided an image sensor comprising a first array of conducting lines extending in a first direction, a second array of conducting lines extending in a second direction perpendicular to the first direction, a matrix of pixels, a transfer gate driver, and a compensation module. A pixel comprises, a photoelectric element accumulating charges therein by absorbing incident light, a transfer transistor transferring the charges to a floating diffusion region in response to a transfer gate signal, and a source follower outputting a voltage of the floating diffusion region as a signal voltage. The transfer gate driver may be configured for applying the transfer gate signal to a gate of the transfer transistor through a conducting line in the first array. The compensation module may be configured for generating a compensation signal that is scaled from a variation signal induced by a variation in the voltage on a conducting line in the first array for receiving the transfer gate signal, the compensation module having a plurality of outputs including one output for compensating the signal voltage from the pixel using the compensation signal.

According to the aforementioned and other exemplary embodiments of the present disclosure, there is provided an image sensor comprising a first array of conducting lines extending in a first direction, a second array of conducting lines extending in a second direction perpendicular to the first direction, a matrix of pixels, a transfer gate driver, a compensation module, and output module. A pixel comprises, a photoelectric element accumulating charges therein by absorbing incident light, a transfer transistor transferring the charges to a floating diffusion region in response to a transfer gate signal, and a source follower outputting a voltage of the floating diffusion region as a signal voltage. The transfer gate driver may be configured for applying the transfer gate signal to a gate of the transfer transistor through a conducting line in the first array. The compensation module may be configured for generating a ramp voltage that is proportional to a sum of an uncompensated ramp signal and a compensation signal, wherein the compensation signal is generated based on scaling from a variation signal induced by a variation in the voltage on a conducting line in the first array for receiving the transfer gate signal. The output module may be configured for outputting a digital code based on comparing the ramp voltage and the signal voltage.

Other features and exemplary embodiments may be apparent from the following detailed description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

Figure 1:
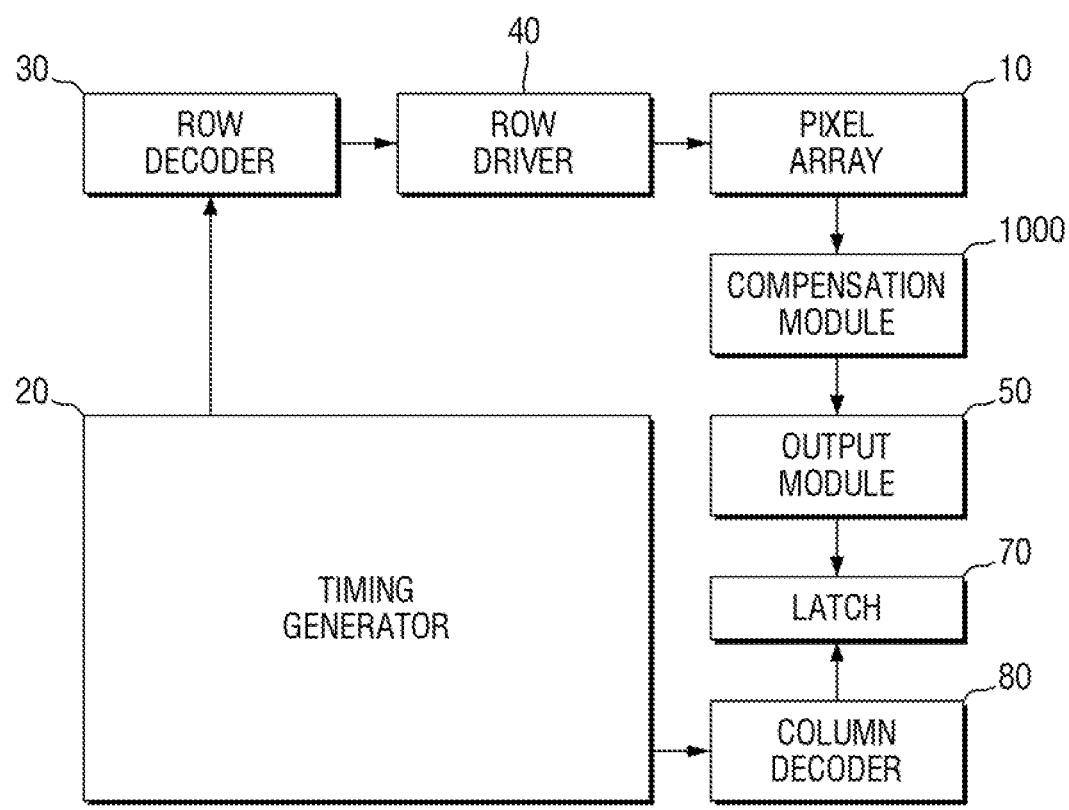
FIG. 1 is a block diagram of an image sensor according to some exemplary embodiments of the present disclosure.

In the accompanying drawings, like reference numerals indicate like elements, but reference numerals for first through fourth P-type metal oxide semiconductors (PMOSs), first and second N-type metal oxide semiconductors (NMOSs), and first and second bias NMOSs, may not necessarily represent the same elements throughout the accompanying drawings.

An image sensor according to some exemplary embodiments of the present disclosure will hereinafter be described with reference to FIGS. 1 through 8.

Figure 2:
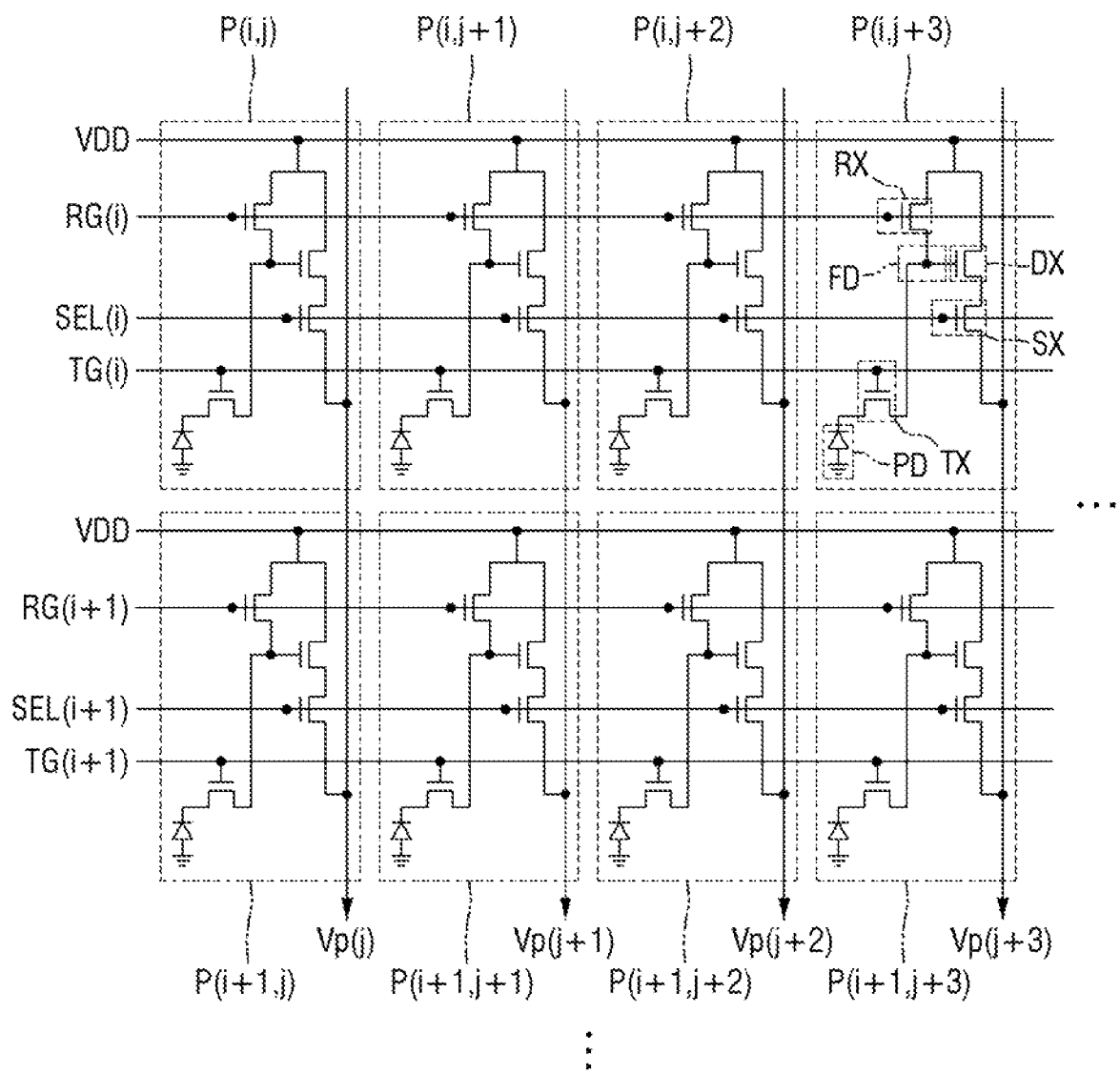
FIG. 2 is an equivalent circuit diagram of a pixel array illustrated in FIG. 1 according to some exemplary embodiments of the present disclosure.
Figure 3:
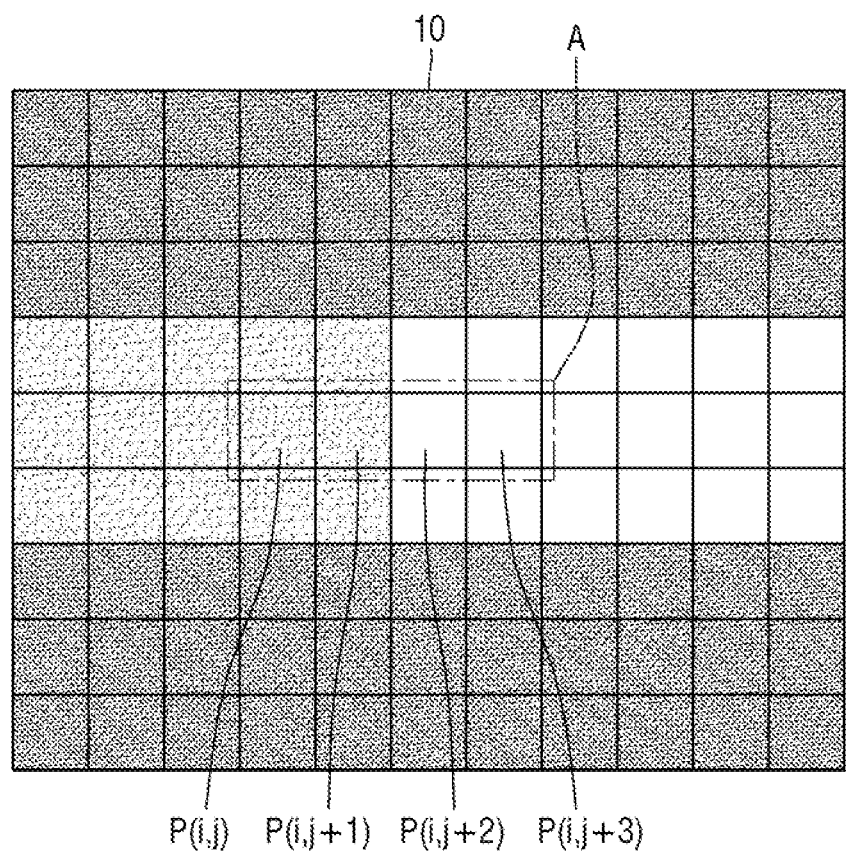
FIG. 3 is a plan view of the pixel array of FIG. 2 for explaining a band noise phenomenon according to some exemplary embodiments of the present disclosure.
Figure 4:
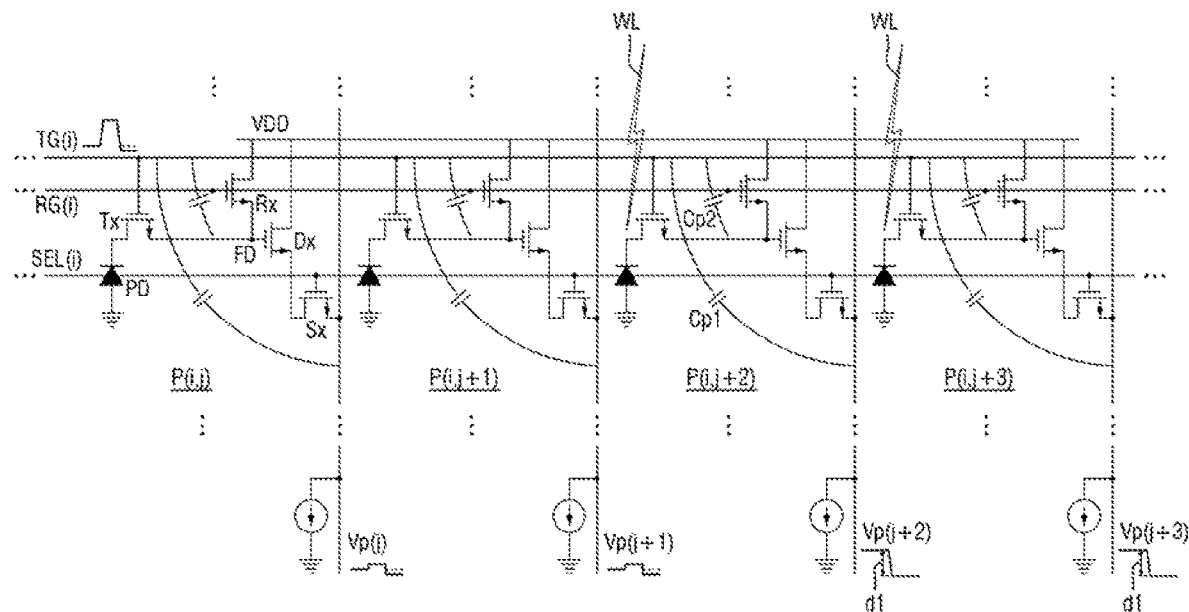
FIG. 4 is an equivalent circuit diagram for explaining the internal structure of the pixel array of FIG. 3 according to some exemplary embodiments of the present disclosure.
Figure 5:
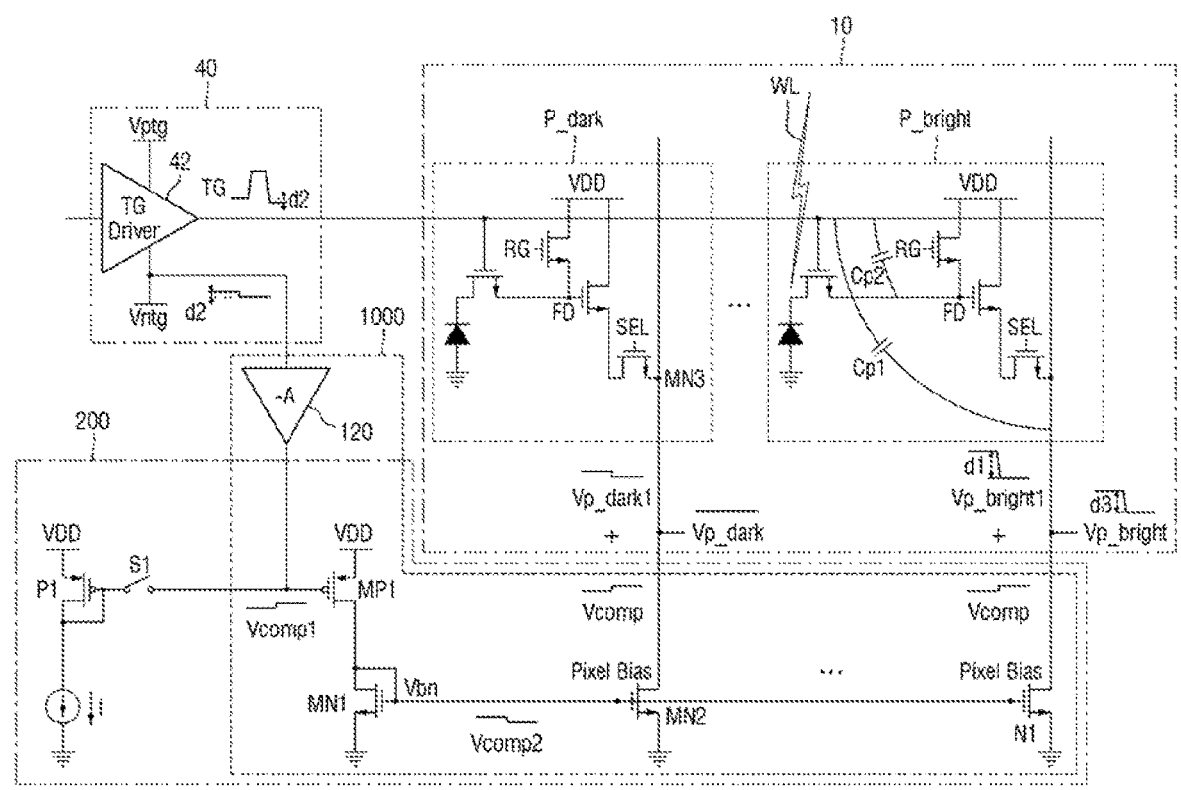
FIG. 5 is a partial equivalent circuit diagram illustrating the structure of the image sensor of FIG. 1 according to some exemplary embodiments of the present disclosure.
Figure 6:
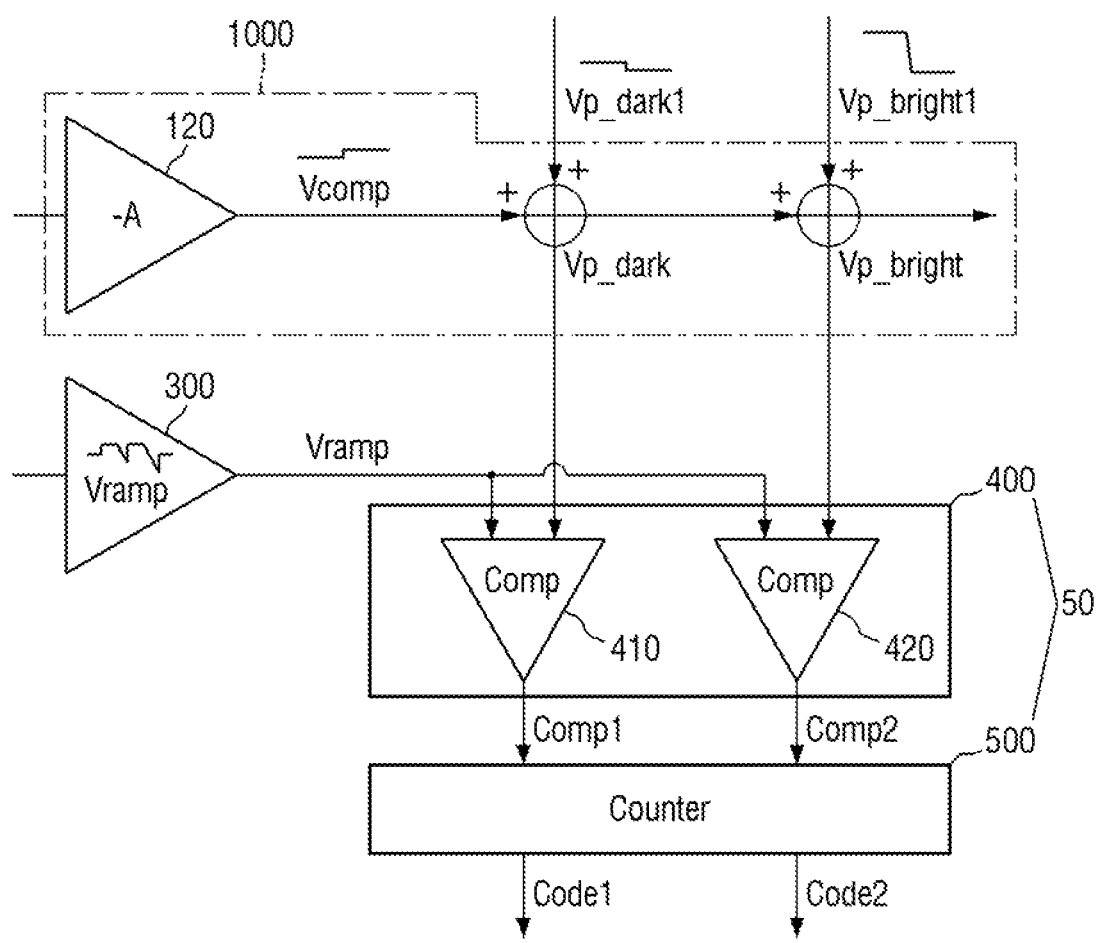
FIG. 6 is a partial conceptual view illustrating the structure of the image sensor of FIG. 5 according to some exemplary embodiments of the present disclosure.
Figure 7:
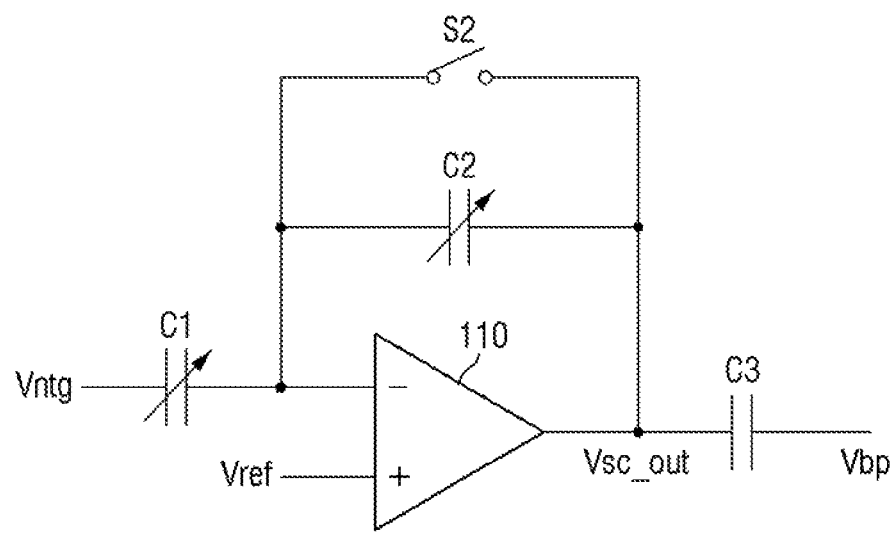
FIG. 7 is an equivalent circuit diagram illustrating an inverting amplifier illustrated in FIG. 5 according to some exemplary embodiments of the present disclosure.
Figure 8:
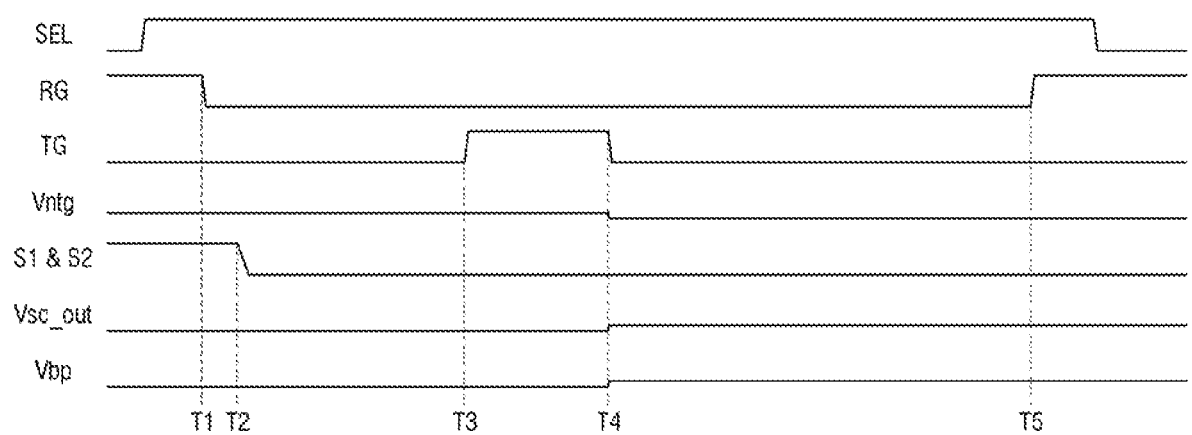
FIG. 8 is a time diagram illustrating the operation of the image sensor of FIGS. 5 and 7 according to some exemplary embodiments of the present disclosure.

According to some exemplary embodiments of the present disclosure, the following figures are presented: FIG. 1 is a block diagram illustrating an image sensor, and FIG. 2 is an equivalent circuit diagram illustrating a pixel array illustrated in FIG. 1; FIG. 3 is a plan view of the pixel array of FIG. 2 for explaining a band noise phenomenon, and FIG. 4 is an equivalent circuit diagram for explaining the internal structure of the pixel array of FIG. 3; FIG. 5 is a partial equivalent circuit diagram illustrating the image sensor of FIG. 1, and FIG. 6 is a partial conceptual view illustrating the structure of the image sensor of FIG. 5; and FIG. 7 is an equivalent circuit diagram illustrating an inverting amplifier illustrated in FIG. 5, and FIG. 8 is a time diagram illustrating the operation of the image sensor of FIGS. 5 and 7.

Referring to FIG. 1, the image sensor according to some exemplary embodiments of the present disclosure includes a pixel array 10 in which pixels including photoelectric elements are arranged in a two-dimensional matrix, a timing generator 20, a row decoder 30, a row driver 40, a first compensation module 1000, an output module 50, a latch module 70, and a column decoder 80.

The pixel array 10 includes a plurality of unit pixels that are arranged in a two-dimensional matrix. Each of the unit pixels converts an optical signal into an electrical output signal. The unit pixel in the pixel array 10 is driven by receiving multiple driving signals such as a row selection signal, a reset signal, and a charge transfer signal from the row driver 40. An electrical output signal from the unit pixel in the pixel array 10 is provided to the output module 50.

The timing generator 20 provides timing signals and control signals to the row decoder 30 and the column decoder 80.

The row driver 40 provides a plurality of driving signals for driving the unit pixels in the pixel array 10 in accordance with the result of decoding performed by the row decoder 30. In a case where the unit pixels are arranged in a matrix of rows and columns, the row driver 40 provides a driving signal to each of the rows of the matrix.

The first compensation module 1000 may perform a compensation operation for preventing the generation of band noise. For example, the first compensation module 1000 may compensate for an output signal from a unit pixel of the pixel array 10. The first compensation module 1000 may generate a compensation voltage and may prevent the generation of band noise by adding the compensation voltage to the output signal from the unit pixel of the pixel array 10 or subtracting the compensation voltage from a ramp signal, and this will be described later.

The output module 50 receives the compensated output signal from the first compensation module 1000 via a vertical signal line and samples and holds the received signal. For example, the output module 50 double-samples a particular noise level and a signal level including a noise level caused by the compensated output signal and outputs a pure signal level corresponding to the difference between the particular noise level and the signal level. The output module 50 converts an analog signal corresponding to the difference between the particular noise level and the signal level into a digital code signal. The digital code signal may be a signal corresponding to the brightness of light applied to each of the unit pixels.

The latch module 70 latches the digital code signal, and the latched signal is sequentially output to an image signal processing module in accordance with the result of decoding performed by the column decoder 80.

Referring to FIG. 2, pixels P are arranged in a matrix form and thus form the pixel array 10. Each of the pixels P includes a photoelectric element PD, a floating diffusion region FD, a charge transfer transistor TX, a drive transistor DX, a reset transistor RX, and a select transistor SX. The functions of the photoelectric element PD, the floating diffusion region PD, the charge transfer transistor TX, the drive transistor DX, the reset transistor RX, and the select transistor SX will hereinafter be described, taking an i-th row of pixels P, i.e., pixels P(i, j), P(i, j+1), P(i, j+2), P(i, j+3), . . . .

The photoelectric element PD absorbs incident light and accumulates charges corresponding to the amount of the absorbed light. A photodiode, a photo-transistor, a photo-gate, a pinned photo-diode, or a combination thereof may be used as the photoelectric element PD. The photoelectric element PD is illustrated in FIG. 2 as being a photodiode according to some exemplary embodiments of the present disclosure.

The photoelectric element PD is coupled to the charge transfer transistor TX, which transmits the charges accumulated in the photoelectric element PD to the floating diffusion region FD. Since the floating diffusion region FD has parasitic capacitance, the floating diffusion region FD can store charges therein accumulatively.

The drive transistor DX, which is an exemplary source follower, converts a variation in the electric potential of the floating diffusion region FD that receives the charges accumulated in the photoelectric element PD into a voltage and outputs the voltage to an output line Vp(j), Vp(j+1), Vp(j+2), or Vp(j+3).

The reset transistor Rx periodically resets the floating diffusion region FD. The reset transistor RX may consist of a single MOS transistor driven by a bias (i.e., a reset signal) provided by a reset line RG(i). In response to the reset transistor RX being turned on by the bias provided by the reset line RG(i), a predetermined electric potential provided to the drain of the reset transistor RX, for example, a power supply voltage VDD, is transmitted to the floating diffusion region FD.

The select transistor SX selects a row of pixels P to be read. The select transistor SX may consist of a single MOS transistor driven by a bias (i.e., a row selection signal) provided by a row selection line SEL(i). In response to the select transistor SX being turned on by the bias provided by the row selection line SEL(i), a predetermined electric potential provided to the drain of the select transistor SX, for example, the power supply voltage VDD, is transmitted to the drain of the drive transistor DX.

A transmission line TG(i), which applies a bias to the charge transfer transistor TX, the reset line RG(i), which applies a bias to the reset transistor RX, and the row selection line SEL(i), which applies a bias to the select transistor SX, may extend substantially in parallel to one another along a row direction.

A band noise phenomenon will hereinafter be described with reference to FIGS. 3 and 4. Since in the pixel array 10, each row of pixels P share the same transmission line, for example, the transmission line TG(i), band noise may be generated, and this will hereinafter be described, taking the pixels P(i, j), P(i, j+1), P(i, j+2), and P(i, j+3) of FIGS. 3 and 4. The pixels P(i, j), P(i, j+1), P(i, j+2), and P(i, j+3) all belong to the i-th row.

For example, dark light may be applied to the pixels P(i, j) and P(i, j+1), and bright light WL may be applied to the pixels P(i, j+2) and P(i, j+3). The bright light WL may have a highest unit of illuminance in signals sensed and output by the image sensor of FIG. 1. For example, the bright light WL applied to the pixels P(i, j+2), P(i, j+3) may be light saturated to have the maximum unit of illuminance.

Basically, the pixels P(i, j), P(i, j+1), P(i, j+2), and P(i, j+3) of the pixel array 10 do not have the same properties. Thus, in response to a gate signal of the transmission line TG(i) being turned on during the output of a reset voltage, signal voltages Vp(j), Vp(j+1), Vp(j+2), and Vp(j+3) may be output to perform correlation double sampling (CDS), which eliminates noise caused by each of the pixels P(i, j), P(i, j+1), P(i, j+2), and and P(i, j+3).

Since the brighter the light applied to the pixels P(i, j), P(i, j+1), P(i, j+2), and P(i, j+3), the larger the amount of charges accumulated in the photoelectric element PD of each of the pixels P(i, j) P(i, j+1), P(i, j+2), and P(i, j+3), the signal voltages Vp(j), Vp(j+1), Vp(j+2), and Vp(j+3) may become much lower than the reset voltage. Thus, as much a voltage drop as a first interval d1 may occur in the signal voltages Vp(j+2) and Vp(j+3) of the pixels P(i, j+2) and P(i, j+3) to which the bright light WL is applied.

Referring to FIG. 4, first parasitic capacitance Cp1 may exist between the output terminals of the pixels P(i, j+2) and P(i, j+3) to which the bright light WL is applied and the transmission line TG(i), and second parasitic capacitance Cp2 may exist between the floating diffusion region FD and the transmission line TG(i). Accordingly, as a voltage drop occurs in the output terminal and the floating diffusion region FD of each of the pixels P(i, j+2) and P(i, j+3), the voltage of the transmission line TG(i) may become lower.

As the voltage of the transmission line TG(i) becomes lower, the signal voltages Vp(j) and Vp(j+1) of the pixels P(i, j) and P(i, j+1) to which dark light is applied may also become lower, and as a result, a band noise phenomenon in which a dark region appears bright in the shape of a band, as illustrated in FIG. 3, may occur.

Referring to FIGS. 5 and 6, the image sensor of FIG. 1 may include the pixel array 10, a transfer gate driver 42, a bias circuit 200, the first compensation module 1000, a ramp voltage generation module 300, and an output module 50.

As already mentioned above, referring to FIG. 5, the pixel array 10 may have an array of pixels that are arranged in rows and columns. The pixel array 10 may include a dark pixel P_dark to which dark light is applied and a bright pixel P_bright to which bright light is applied. The dark pixel P_dark and the bright pixel P_bright may be located in the same row of the pixel array 10. For convenience, it is assumed that light that is bright enough to cause band noise is applied to the bright pixel P_bright.

The dark pixel P_dark may output a dark signal voltage Vp_dark, and the bright pixel P_bright may output a bright signal voltage Vp_bright.

The row driver 40 may include the transfer gate driver 42. The transfer gate driver 42 may generate a transfer gate signal TG. The transfer gate signal TG may be the same as the signal applied to the transmission line TG(i) of FIGS. 2 and 4.

The transfer gate driver 42 may generate the transfer gate signal TG using first and second voltages Vptg and Vntg. For example, the maximum level of the transfer gate signal TG may be the first voltage Vptg, and the minimum level of the transfer gate signal TG may be the second voltage Vntg.

In some embodiments, in a scenario when a compensation operation is not performed by the first compensation module 1000, a voltage drop indicated as the first interval d1 may occur in a first bright signal voltage Vp_bright1, which is the output voltage of the bright pixel P_bright, because of the bright light applied to the bright pixel P_bright. As a result, in some situations, the second voltage Vntg may become slightly lower. For example, the second voltage Vntg may be lowered by as much as a second interval d2. The second interval d2 may be smaller than the first interval d1 because the second interval d2 is generated by the first and second parasitic capacitances Cp1 and Cp2.

Since the second interval d2 is generated when a compensation operation is not performed by the first compensation module 1000, a first dark signal voltage Vp_dark1, which is the output voltage of the dark pixel P_dark, may become lower.

The bias circuit 200 may modify the output voltage of each pixel of the pixel array 10. In some embodiments, when the output terminal of each pixel of the pixel array 10 is composed of a source follower, the bias circuit 200 may modify the output of each pixel of the pixel array 10 by completing the configuration of the source follower of each pixel of the pixel array 10.

The bias circuit 200 may form a bias current via a first PMOS P1, a current source 1, and the power supply voltage VDD, and may mirror the bias current via a mirror circuit including a first bias PMOS MP1, a first bias NMOS MN1, a second bias NMOS MN2, and a first NMOS N1. As used herein, the term "mirroring" refers to allowing a current that flows at one end to flow at the other end in the same magnitude or a scaled magnitude that is scaled from the same magnitude. The scaled magnitude in which to mirror a current may be determined by the current-voltage characteristics of each PMOS/NMOS element.

The bias circuit 200 of FIG. 5 is merely exemplary, and the present disclosure is not limited thereto. For example, the image sensor of FIG. 5 may employ a bias circuit 200 having a different configuration from that illustrated in FIG. 5.

In some embodiments, as shown in FIG. 5, the first compensation module 1000 may detect a variation in the second voltage Vntg. For example, the first compensation module 1000 may detect a drop in the second voltage Vntg induced by a variation in the voltage of the transmission line TG(i) that is connected to the transfer gate driver 42. The first compensation module 1000 may invert a variation in the second voltage Vntg. The first compensation module 1000 may generate a first compensation voltage Vcomp1 by inverting a variation in the second voltage Vntg. The first compensation voltage Vcomp1 may be obtained by scaling a variation in the second voltage Vntg.

In some embodiments, the first compensation module 1000 may detect a variation in the voltage of the transmission line TG(i) that is connected to the transfer gate driver 42. For example, the first compensation module 1000 may detect a variation in the voltage of the conducting line for receiving the transfer gate signal. A first compensation voltage Vcomp1 may be generated by scaling the variation in the voltage on the transmission line TG(i) (i.e., the conducting line for receiving the transfer gate signal). In some embodiments, the first compensation voltage Vcomp1 may be generated at the output of a buffer amplifier that has an input connecting to the transmission line TG(i) that is connected to the transfer gate driver 42

The first compensation voltage Vcomp1 may be transmitted to the bias circuit 200. For example, the first compensation voltage Vcomp1 may be transmitted to the gate terminal of the first bias PMOS MP1 of the bias circuit 200.

The first compensation module 1000 may include a mirroring circuit portion of the bias circuit 200. The first compensation module 1000 may scale the first compensation voltage Vcomp1 to obtain a compensation voltage Vcomp and may further transmit the compensation voltage Vcomp to the corresponding pixel units for adding the compensation voltage Vcomp to the dark signal voltage Vp_dark and the bright signal voltage Vp_bright.

For example, the first compensation voltage Vcomp1 may be scaled into a second compensation voltage Vcomp2 via the first bias PMOS MP1 and the first bias NMOS MN1, and the second compensation voltage Vcomp2 may be scaled into the compensation voltage Vcomp via the second bias NMOS MN2 and the first NMOS N1.

Referring to FIGS. 5 and 6, the dark pixel P_dark and the bright pixel P_bright may output the first dark signal voltage Vp_dark 1 and the first bright signal voltage Vp_bright1. The first compensation module 1000 may generate the first compensation voltage Vcomp1, and scale the first compensation voltage Vcomp1 to obtain a compensation voltage Vcomp. The compensation voltage Vcomp may be added to the first dark signal voltage Vp_dark1 and the first bright signal voltage Vp_bright1. By adding this compensation voltage Vcomp, the final output voltage of the dark pixel P_dark may become the dark signal voltage Vp_dark, and the final output voltage of the bright pixel P_bright may become the bright signal voltage Vp_bright.

Due to a band noise phenomenon, an unintended voltage drop may occur in the first dark signal voltage Vp_dark1, but such voltage drop in the first dark signal voltage Vp_dark1 may be offset by adding the compensation voltage Vcomp to the first dark signal voltage Vp_dark1. Accordingly, a band noise phenomenon in the dark pixel P_dark can be prevented.

On the other hand, a voltage drop in the first bright signal voltage Vp_bright1 may be reduced from the first interval d1 to a third interval d3 by the compensation voltage Vcomp. For example, the third interval d3 may be smaller than the first interval d1. The third interval d3 may be an interval obtained by excluding the compensation voltage Vcomp from the first interval d1.

The first bright signal voltage Vp_bright1 and the bright signal voltage Vp_bright may both have a maximum level when they are converted into a second digital code "code2" that will be described later. For example, since light whose illuminance is high enough to cause band noise already has a saturated output, the addition of the compensation voltage Vcomp does not change, or hardly affects, the result. Thus, the image sensor of FIG. 5 can eliminate band noise in the dark pixel P_dark without changing the result value of the bright pixel P_bright.

Referring to FIG. 6, the ramp voltage generation module 300 may generate a ramp voltage Vramp. The ramp voltage Vramp is a signal for converting an analog signal into a digital signal and may have the shape of a triangular wave.

The output module 50 may include a comparator unit 400 and a counter 500.

The comparator unit 400 may include first and second comparators 410 and 420. FIG. 6 illustrates an example in which the comparator unit 400 includes two comparators, but in another example, the comparator unit 400 may include as many comparators as there are columns in the pixel array 10. For example, a signal voltage output by each column of the pixel array 10 may be compared with the ramp voltage Vramp using a corresponding comparator in the comparator unit 400.

The first comparator 410 may compare the ramp voltage Vramp and the dark signal voltage Vp_dark and may output a first comparison signal comp1. The first comparison signal comp1 may be a binary digital signal obtained by comparing the ramp voltage Vramp and the dark signal voltage Vp_dark. For example, if the ramp voltage Vramp is higher than the dark signal voltage Vp_dark, the first comparison signal comp1 may be output as "1", and if the ramp voltage Vramp is lower than the dark signal voltage Vp_dark, the first comparison signal comp1 may be output as "0". In another example, if the ramp voltage Vramp is higher than the dark signal voltage Vp_dark, the first comparison signal comp1 may be output as "0", and if the ramp voltage Vramp is lower than the dark signal voltage Vp_dark, the first comparison signal comp1 may be output as "1".

The second comparator 420 may compare the ramp voltage Vramp and the bright signal voltage Vp_bright and may output a second comparison signal comp2. The second comparison signal comp2 may be a binary digital signal obtained by comparing the ramp voltage Vramp and the bright signal voltage Vp_bright.

The counter 500 may receive the first and second comparison signals comp1 and comp2 and may perform counting in accordance with a clock signal. In one embodiments, the counter 500 may measure how many edges of the clock signal have occurred separately during each of the two time period as identified by the first and second comparison signals comp1 and comp2, such that the counter 500 may provide illuminance information of incident light applied to each of the dark pixel P_dark and the bright pixel P_bright as digital information. For example, the counter 500 may generate a first digital code "code1" by counting the clock signal with the first comparison signal comp1, and may generate a second digital code "code2" by counting the clock signal with the second comparison signal comp2.

As the first and second comparison signals comp1 and comp2 increase their time duration, the counts of the clock signal associated with the first and second comparison signals comp1 and comp2, produced by the counter 500, become greater, and as a result, the values of the first and second digital codes "code1" and "code2" become greater. For example, the lengths of the first and second comparison signals comp1 and comp2 are proportional to the magnitudes of the dark signal voltage Vp_dark and the bright signal voltage Vp_bright. The magnitudes of the dark signal voltage Vp_dark and the bright signal voltage Vp_bright may correspond to the illuminance of light applied to each pixel. Consequently, the first and second digital codes "code1" and "code2" may correspond to the illuminance of light applied to each pixel.

Referring to FIG. 7, the first compensation module 1000 may include an inverting amplifier 120. For example, the first compensation module 1000 may be a circuit in which a reference voltage Vref is applied to the positive terminal of an operational amplifier 110 and a first variable capacitor C1 and the second voltage Vntg are connected to the negative terminal of the operational amplifier 110. The negative terminal of the operational amplifier 110 may be connected to a compensation output voltage Vsc_out via a second variable capacitor C2, and a second switch S2 may be provided in parallel to the second variable capacitor C2.

Referring to FIGS. 5 and 7, a third capacitor C3 may be provided between the compensation output voltage Vsc_out and a gate terminal Vbp of the first bias PMOS MP1.

A first switch S1 of the bias circuit 200 is connected to the third capacitor C3. The first switch S1 reduces noise at the front end thereof and allows the first compensation voltage Vcomp1 to vary in accordance with variations in the compensation output voltage Vsc_out. The second switch S2 of the first compensation module 1000 may be used to set an initial voltage of the inverting amplifier 120. Thus, the first and second switches S1 and S2 may operate simultaneously to be initially closed and then to be continuously open.

The first compensation voltage Vcomp1 may be a voltage obtained by multiplying a variation in the second voltage Vntg, i.e., $\Delta$Vntg, by a gain $-A$ of the inverting amplifier 120, i.e., $-C1/C2$. Here, C1 denotes the capacitance of the first variable capacitor C1, and C2 denotes the capacitance of the second variable capacitor C2. That is, $\Delta$Vcomp1=$\Delta$Vntg$\times$$-$C1/C2.

The second compensation voltage Vcomp2 may be a voltage obtained by scaling the first compensation voltage Vcomp1 via the first bias PMOS MP1 and the first bias NMOS MN1. That is, $\Delta$Vcomp2=$\Delta$Vcomp1$\times$$-$gmp1/gmn1. Here, gmp1 denotes the transconductance of the first bias PMOS MP1, and gmn1 denotes the transconductance of the first bias NMOS MN1.

The compensation voltage Vcomp may be a voltage obtained by scaling the second compensation voltage Vcomp via the second bias NMOS MN2 and the select transistor SX of the dark pixel P_dark. The compensation voltage Vcomp may also be a voltage obtained by scaling the second compensation voltage Vcomp via the first NMOS N1 and the select transistor SX of the bright pixel P_bright.

Assuming that the second bias NMOS MN2 and the first NMOS N1 have the same transconductance and the select transistor SX of the dark pixel P_dark and the select transistor SX of the bright pixel P_bright have the same transconductance, the compensation voltage Vcomp applied to the dark pixel P_dark and the compensation voltage Vcomp applied to the bright pixel P_bright may be the same.

That is, $\Delta$Vcomp=$\Delta$Vcomp2$\times$$-$gmn2/gmn3. Here, gmn2, denotes the transconductance: of the second NMOS MN2 and the first NMOS N1, and gmn3 denotes the transconductance of the select transistor SX of the dark pixel P_dark and the select transistor SX of the bright pixel P_bright.

Thus, $\Delta$Vcomp=$\Delta$Vntg$\times$$-$C1/C2$\times$$-$gmp1/gmn1$\times$$-$gmn2/gmn3. Since gmp1, gmn1, gmn2, and gmn3 are parameters that are relatively easy to control, the compensation voltage Vcomp can be appropriately scaled by controlling the capacitances of the first and second variable capacitors C1 and C2.

The operation of the image sensor of FIG. 5 will hereinafter be described with reference to FIGS. 5, 7, and 8. A selection signal SEL for selecting a row of the pixel array 10 may be turned on first, and then, a reset gate signal RG for the reset voltage that is continuously output may be turned off at a first time T1. The first and second switches S1 and S2 that are closed for setting an initial state and eliminating noise from the power supply voltage VDD may be opened at a second time T2.

Thereafter, the transfer gate signal TG may be turned on at a third time T3. As a result, the charges accumulated in the photoelectric element PD may be transmitted to the floating diffusion region FD. The transfer gate signal TG may be turned off at a fourth time T4.

Due to the parasitic capacitor of the bright pixel P_bright, the second voltage Vntg may drop during a period between the third time T3 and the fourth time T4. FIG. 8 illustrates the second voltage Vntg as dropping at the fourth time T4, but the present disclosure is not limited thereto. The second voltage Vntg may slowly drop over the period between the third time T3 and the fourth time T4.

Due to the drop in the second voltage Vntg, the compensation output voltage Vsc_out of the first compensation module 1000 may have the same level as a voltage that is inverted by a variation in the second voltage Vntg, the first compensation voltage Vcomp1. Accordingly, a gate voltage Vbp of the first bias PMOS MP1 may have the same level as the first compensation voltage Vcomp1.

Thereafter, when the output of each pixel is complete, the reset gate signal RG may be turned on again at a fifth time T5.

The image sensor of FIG. 5 can reduce a band noise phenomenon in which pixels to which bright light is applied affect other pixels in their row and can thus produce better sensing results.

According to some exemplary embodiments of the present disclosure, a compensation module is disclosed above to generate a ramp voltage that is proportional to a sum of an uncompensated ramp signal (e.g., the ramp voltage Vramp) and a compensation signal (e.g., the compensation voltage Vcomp). The compensation signal may be generated based on scaling from a variation signal induced by a variation in a voltage (e.g., a variation in the transfer gate signal TG) on the conducting line for receiving the transfer gate signal. In some embodiments, the induced variation signal may be second interval d2 in the second voltage Vntg, and the compensation signal may be scaled from this second interval d2 in the second voltage Vntg. In other embodiments, the induced variation signal can be other signal change induced by the variation in the transfer gate signal TG.

An image sensor according to some exemplary embodiments of the present disclosure will hereinafter be described with reference to FIGS. 7 and 9 through 11, and any redundant descriptions of the image sensor of FIG. 5 will be avoided.

Figure 9:
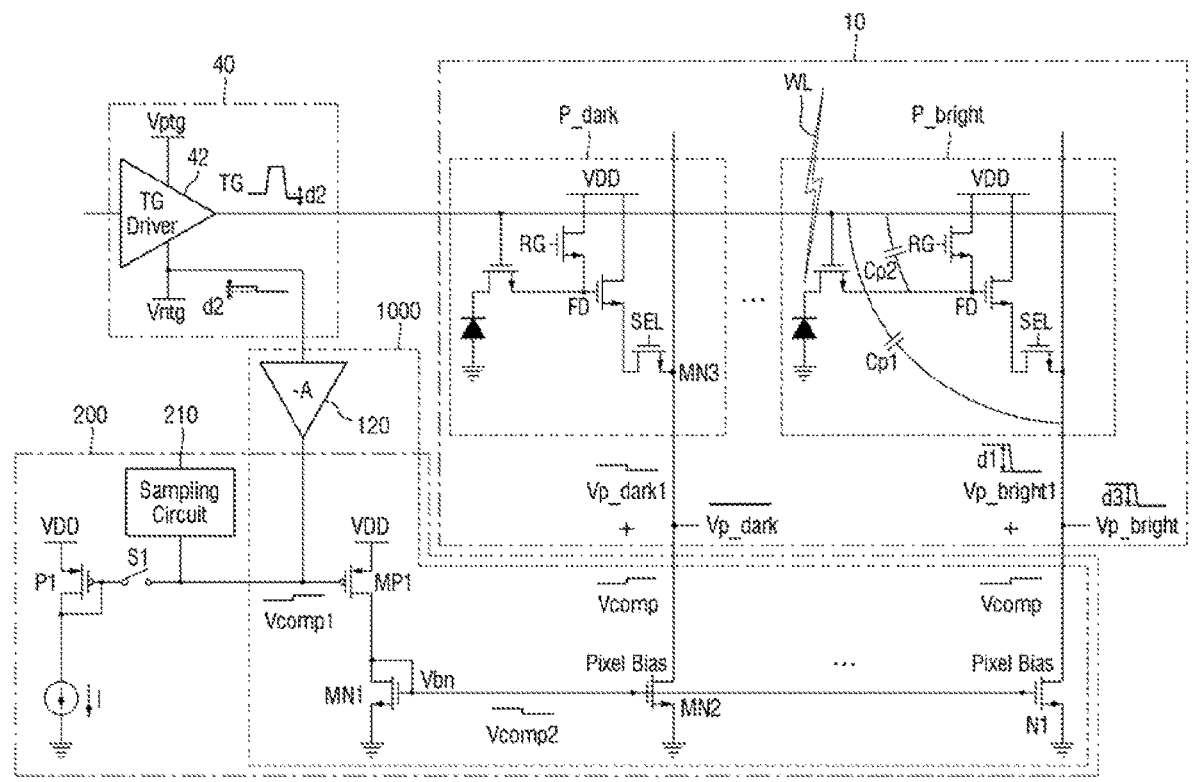
FIG. 9 is a partial equivalent circuit diagram illustrating the structure of an image sensor according to some exemplary embodiments of the present disclosure.
Figure 10:
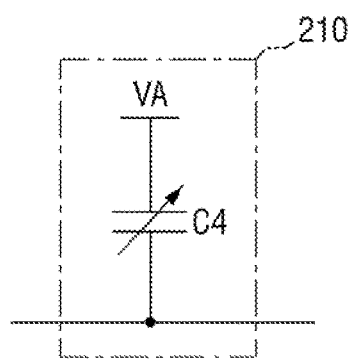
FIG. 10 is an equivalent circuit diagram illustrating an exemplary sampling circuit of the image sensor of FIG. 9 according to some exemplary embodiments of the present disclosure.
Figure 11:
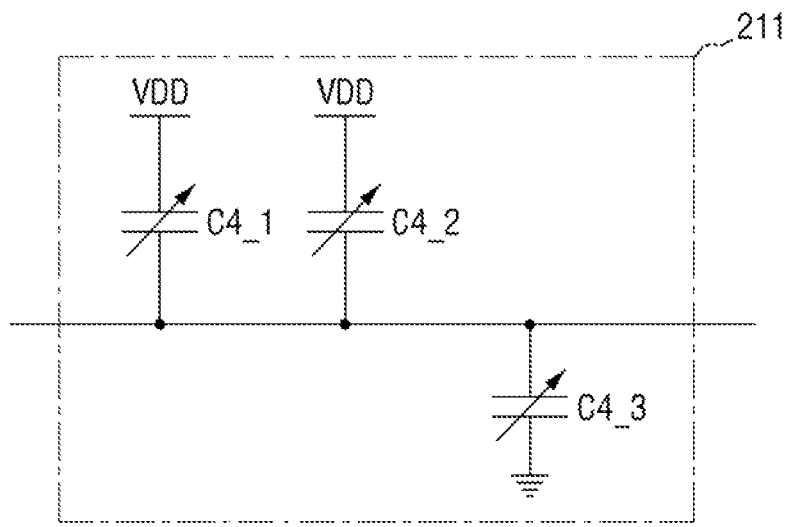
FIG. 11 is an equivalent circuit diagram illustrating another exemplary sampling circuit of the image sensor of FIG. 9 according to some exemplary embodiments of the present disclosure.

FIG. 9 is a partial equivalent circuit diagram illustrating the structure of an image sensor according to some exemplary embodiments of the present disclosure, and FIG. 10 is an equivalent circuit diagram illustrating an exemplary sampling circuit of the image sensor of FIG. 9. FIG. 11 is an equivalent circuit diagram illustrating another exemplary sampling circuit of the image sensor of FIG. 9.

Referring to FIGS. 7 and 9, the image sensor according to some exemplary embodiments of the present disclosure may include a first sampling circuit 210.

The first sampling circuit 210 may be disposed between a first switch S1 and a first bias PMOS MP1 of a bias circuit 200. The first sampling circuit 210 may reduce noise at the front end of the first switch S1 together with the first switch S1.

Referring to FIG. 10, the first sampling circuit 210 may include a fourth variable capacitor C4, which is connected to a voltage VA. The first sampling circuit 210 may control a power supply rejection ratio (PSRR) characteristic by matching the gate voltage of a PMOS to a power supply voltage VDD or a ground voltage VSS.

The fourth variable capacitor C4 of the first sampling circuit 210 may be used to control the gain of a first compensation module 1000.

That is, $\Delta Vcomp1 = \Delta Vntg \times -C1/C2 \times C3/(C3+C4)$.

Here, C3 denotes the capacitance of a third capacitor C3, and C4 denotes the capacitance of the fourth variable capacitor C4.

Finally, $\Delta Vcomp = \Delta Vntg \times -C1/C2 \times C3/(C3+C4) \times -gmp1/gmn1 \times -gmn2/gmn3$.

In the exemplary embodiment of FIGS. 9 through 11, the capacitance of the third capacitor C3 may be fixed, but the present disclosure is not limited thereto. The third capacitor C3 may also be a variable capacitor, in which case, the capacitance of the third capacitor C3 may be an adjustable parameter.

In a case where the capacitances of first and second capacitors C1 and C2 and the capacitances of the third and fourth capacitors C3 and C4 are all adjustable parameters, the scaling of a compensation voltage Vcomp can be further facilitated. Also, in the case of an inverting amplifier, noise may have an output that has less influence as compared to its degree of amplification. Thus, a maximum gain can be set using the first and second capacitors C1 and C2, and a detailed scaling can be performed using the third and fourth capacitors C3 and C4 that are more affected by noise.

Referring to FIG. 11, the image sensor according to some exemplary embodiments of the present disclosure may include a second sampling circuit 211.

The second sampling circuit 211 may include first, second, and third sub-capacitors C4_1, C4_2, and C4_3. FIG. 11 illustrates an example in which the second sampling circuit 211 has three sub-capacitors, but the present disclosure is not limited thereto. In another example, the second sampling circuit 211 may have two sub-capacitors or four or more sub-capacitors.

The first and second sub-capacitors C4_1 and C4_2 may be connected to a power supply voltage VDD and the third sub-capacitor C4_3 may be grounded. The first and second sub-capacitors C4_1 and C4_2 may perform the functions of the fourth variable capacitor C4 of FIG. 10. For example, the first and second sub-capacitors C4_1 and C4_2 may alleviate noise in the power supply voltage VDD.

Since the output of a pixel array 10 has noise because of the power supply voltage VDD, the third sub-capacitor C4_3 may be grounded to alleviate the noise in the output of the pixel array 10. FIG. 11 illustrates an example in which the second sampling circuit 211 is connected to the power supply voltage VDD and a ground voltage at a ratio of 2:1, but the present disclosure is not limited thereto. The ratio at which the second sampling circuit 211 is connected to the power supply voltage VDD and the ground voltage may vary as necessary.

An image sensor according to some exemplary embodiments of the present disclosure will hereinafter be described with reference to FIGS. 12 and 13, and any redundant descriptions of the image sensors of FIGS. 5 and 9 through 11 will be avoided.

Figure 12:
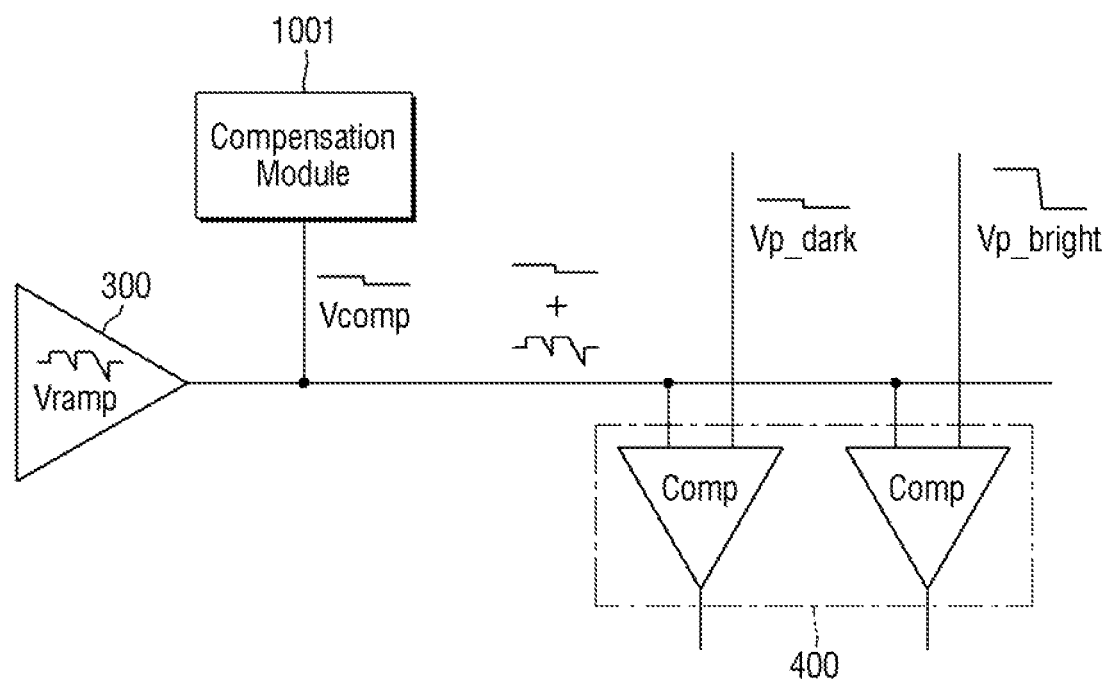
FIG. 12 is a partial equivalent circuit diagram illustrating the structure of an image sensor according to some exemplary embodiments of the present disclosure.
Figure 13:
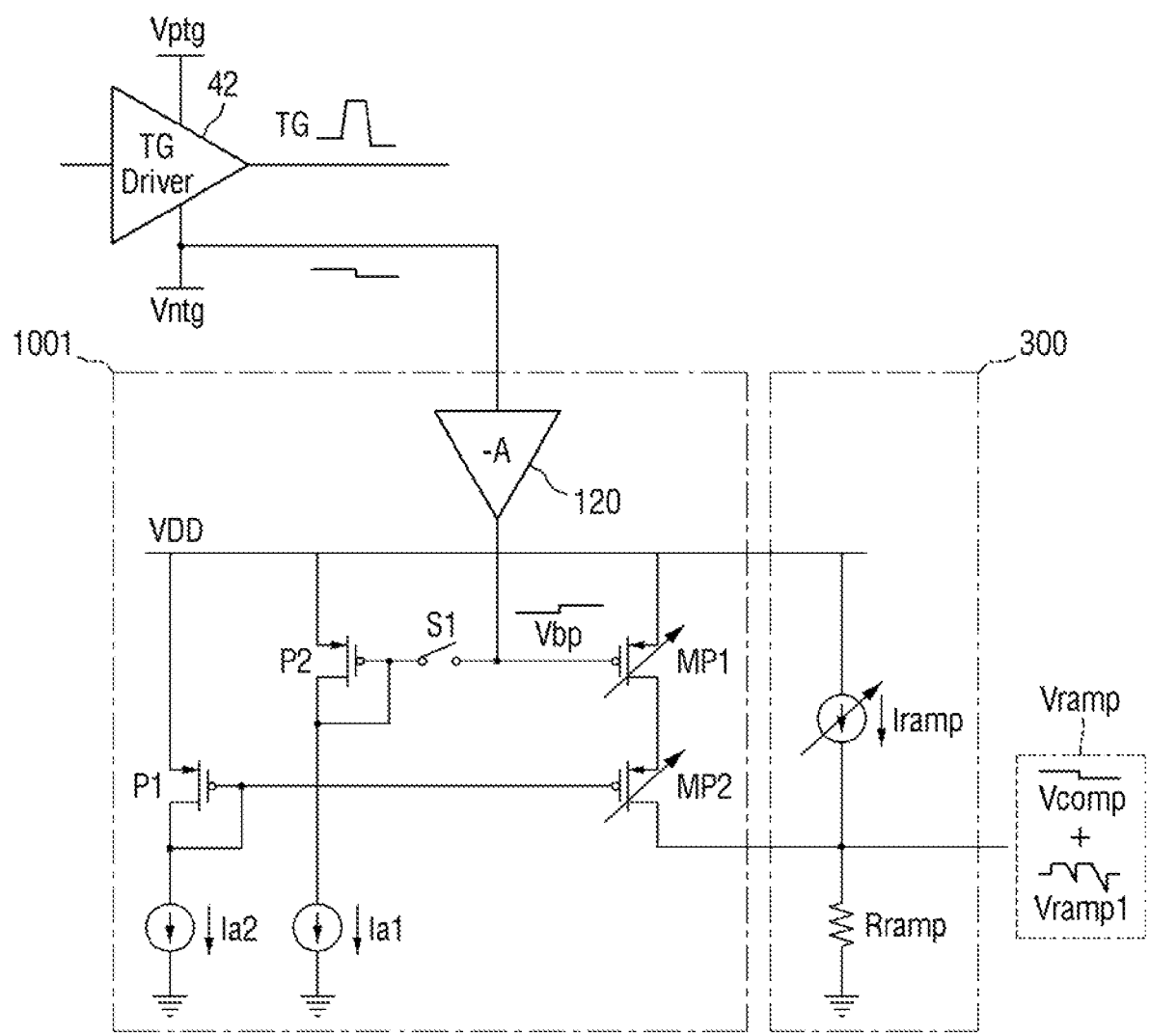
FIG. 13 is a partial equivalent circuit diagram illustrating an exemplary ramp voltage generation module and a compensation module of the image sensor of FIG. 12 according to some exemplary embodiments of the present disclosure.

FIG. 12 is a partial equivalent circuit diagram illustrating the structure of an image sensor according to some exemplary embodiments of the present disclosure, and FIG. 13 is a partial equivalent circuit diagram illustrating an exemplary ramp voltage generation module and a compensation module of the image sensor of FIG. 12.

Referring to FIG. 12, the image sensor according to some exemplary embodiments of the present disclosure may compensate for a ramp voltage Vramp, instead of a dark signal voltage Vp_dark and a bright signal voltage Vp_bright.

Referring to FIG. 12, a second compensation module 1001 may perform a compensation operation. The second compensation module 1001 may add a non-inverted compensation voltage Vcomp to an uncompensated ramp signal to generate a ramp voltage that is compensated. A comparison module 400 produces the difference between the compensated ramp voltage and the dark signal voltage Vp_dark or the bright signal voltage Vp_bright and uses such difference to generate its output, for preventing the occurrence of band noise simply by compensating for the ramp voltage Vramp.

For example, referring to FIG. 13, the second compensation module 1001 may invert the second voltage Vntg via an inverting amplifier 120 and may provide the inverted second voltage Vntg as a gate voltage of a first bias PMOS MP1.

In this case, $\Delta Vbp=\Delta Vntg \times -A$.

Here, Vbp denotes the gate voltage of the first bias PMOS MP1, and $-A$ denotes the gain of the inverting amplifier 120.

The first bias PMOS MP1 may be the mirror circuit of a circuit consisting of a second PMOS P2 and a first current source Ia1. The second bias PMOS MP2 may be connected to the mirror circuit of a circuit consisting of a first PMOS P1 and a second current source Ia2 and may be cascode-connected to the first bias PMOS MP1. In this manner, the drain currents of the first second bias PMOSs MP1 and MP2 can be stabilized.

A variation in the current of the first PMOS MP1 may be represented as $\Delta Vbp \times -gmp1$. Here, gmp1 denotes the transconductance of the first bias PMOS MP1. The current of the first bias PMOS MP1 flows to a ramp resistor Rramp, and a voltage drop occurs. This voltage drop may be the compensation voltage Vcomp.

Accordingly, $\Delta Vcomp = \Delta Vntg \times -A \times -gmp1 \times Rramp$.

Here, Rramp denotes the resistance of the ramp resistor Rramp. By setting $-gmp1$ to be variable, the compensation voltage Vcomp can be easily controlled.

The ramp voltage Vramp is generated by adding up a first ramp voltage Vramp1, which is generated by a ramp current tramp via the ramp resistor Rramp, and the compensation voltage Vcomp.

An image sensor according to some exemplary embodiments of the present disclosure will hereinafter be described with reference to FIGS. 12 and 14, and any redundant descriptions of the image sensors of FIGS. 5, 9 through 11, and 13 will be avoided.

Figure 14:
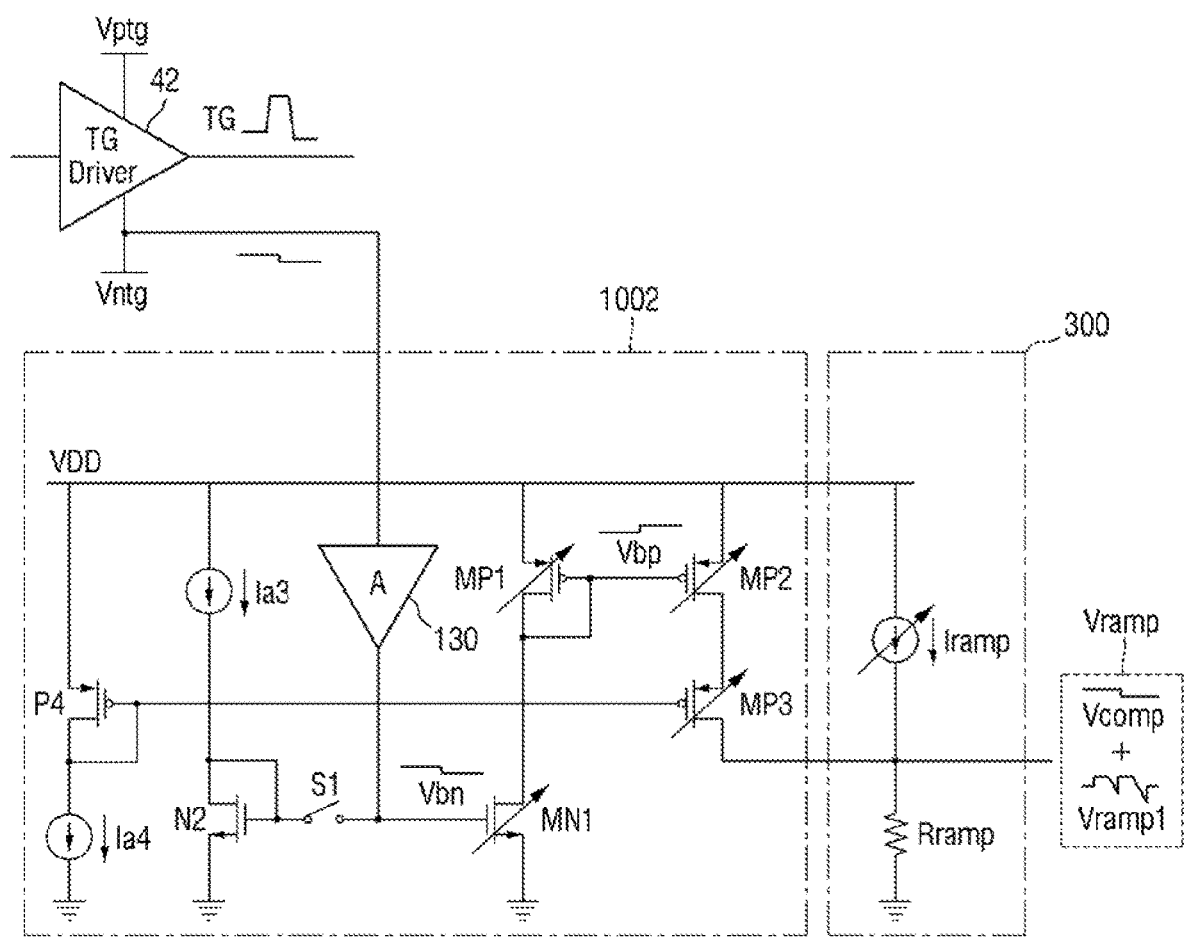
FIG. 14 is a partial equivalent circuit diagram illustrating another exemplary ramp voltage generation module and another compensation module of the image sensor of FIG. 12 according to some exemplary embodiments of the present disclosure.

FIG. 14 is a partial equivalent circuit diagram illustrating another exemplary ramp voltage generation module and another compensation module of the image sensor of FIG. 12.

Referring to FIGS. 12 and 14, a third compensation module 1002 may add a non-inverted compensation voltage Vcomp to an uncompensated ramp signal to generate a ramp voltage that is compensated by the compensation voltage Vcomp.

For example, referring to FIG. 14, the third compensation module 1002 may provide a variation in the second voltage Vntg as a gate voltage of a first bias NMOS MN1 via a non-inverting amplifier 130. In this case, $\Delta Vbn=\Delta Vntg \times A$. Here, Vbn denotes the gate voltage of the first bias NMOS MN1, and A denotes the gain of the non-inverting amplifier 130.

The first bias NMOS MN1 may be a mirror circuit consisting of a second NMOS N2 and a third current source Ia3. The first bias NMOS MN1 may be connected in series to a first bias PMOS MP1, and a second bias PMOS MP2 may be scaled in accordance with the current voltage characteristics of the first bias NMOS MN1 and the first bias PMOS MP1. That is, $\Delta Vbp=\Delta Vbn \times -gmn1/gmp1$. Here, gmn1 denotes the transconductance of the first bias NMOS MN1. By setting gmn1 and gmp1 to be variable, the compensation voltage Vcomp can be easily controlled.

A third bias PMOS MP3 may be connected to the mirror circuit of a circuit consisting of a fourth PMOS P4 and a fourth current source Ia4 and may be cascode-connected to the second bias PMOS MP2. In this manner, the drain currents of the second and third PMOSs MP2 and MP3 can be stabilized.

A variation in the current of the second PMOS MP2 may be represented as $\Delta Vbp \times -gmp2$. Here, gmp2 denotes the transconductance of the second bias PMOS MP2. The current of the second bias PMOS MP2 flows to a ramp resistor Rramp, and a voltage drop is generated. This voltage drop may be the compensation voltage Vcomp.

Accordingly, $\Delta Vcomp = \Delta Vntg \times A \times -gmn1/gmp1 \times gmp2 \times Rramp$.

The ramp voltage Vramp is generated by adding a first ramp voltage Vramp1, which is generated by a ramp current tramp via the ramp resistor Rramp, and the compensation voltage Vcomp.

An image sensor according to some exemplary embodiments of the present disclosure will hereinafter be described with reference to FIGS. 12 and 15, and any redundant descriptions of the image sensors of FIGS. 9 through 11, 13, and 14 will be avoided.

Figure 15:
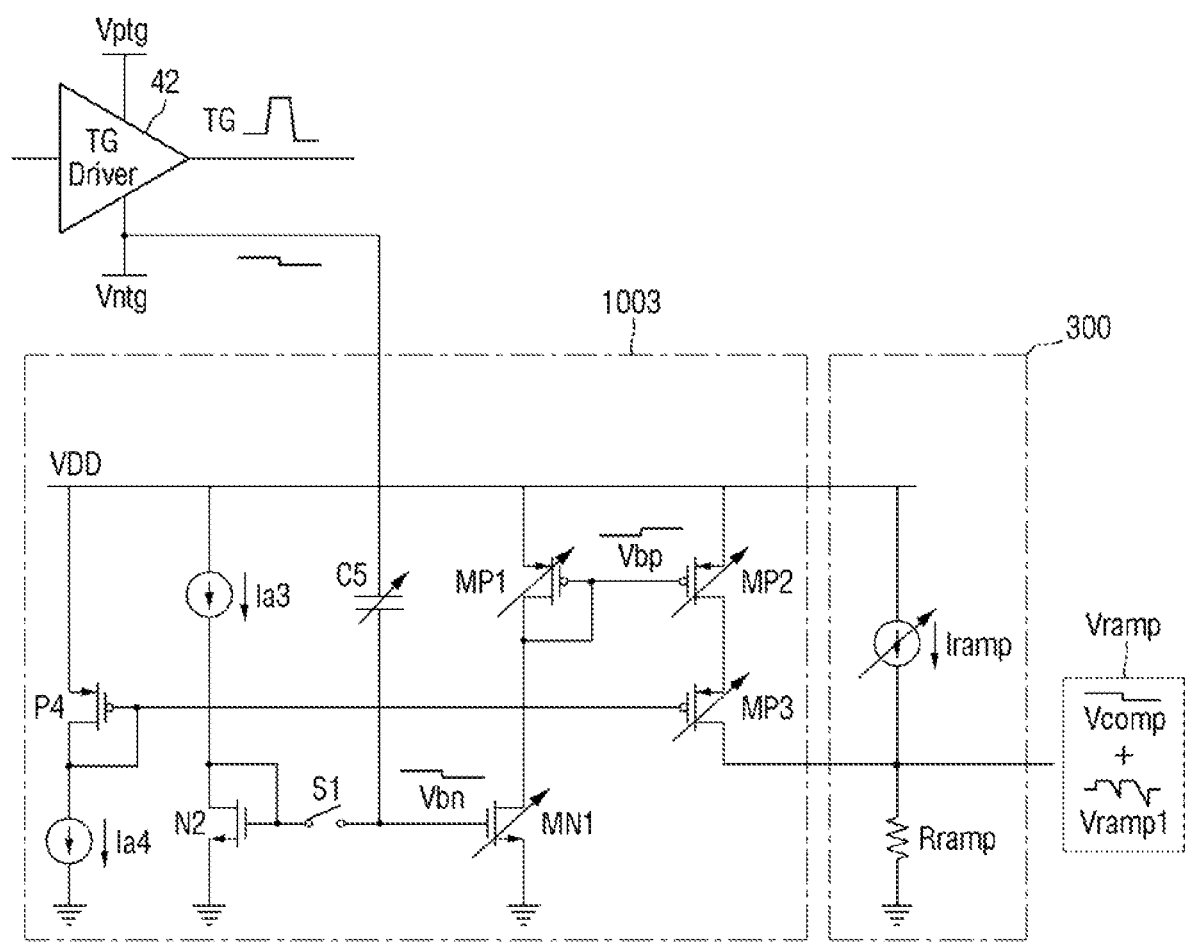
FIG. 15 is a partial equivalent circuit diagram illustrating another exemplary ramp voltage generation module and another compensation module of the image sensor of FIG. 12 according to some exemplary embodiments of the present disclosure.

FIG. 15 is a partial equivalent circuit diagram illustrating another exemplary ramp voltage generation module and another compensation module of the image sensor of FIG. 12.

Referring to FIGS. 12 and 15, the image sensor according to some exemplary embodiments of the present disclosure may include a fourth compensation module 1003.

The fourth compensation module 1003 may include a fifth variable capacitor C5, instead of the non-inverting amplifier 130 of FIG. 14.

The fifth variable capacitor C5 may transmit a signal without amplifying it. Thus, $\Delta Vbn=\Delta Vntg$.

Accordingly, $\Delta Vcomp = \Delta Vntg \times -gmn1/gmp1 \times -gmp2 \times Rramp$.

An image sensor according to some exemplary embodiments of the present disclosure will hereinafter be described with reference to FIG. 16, and any redundant descriptions of the image sensors of FIGS. 5, 9 through 11, 12, 13, 14, and 15 will be avoided.

Figure 16:
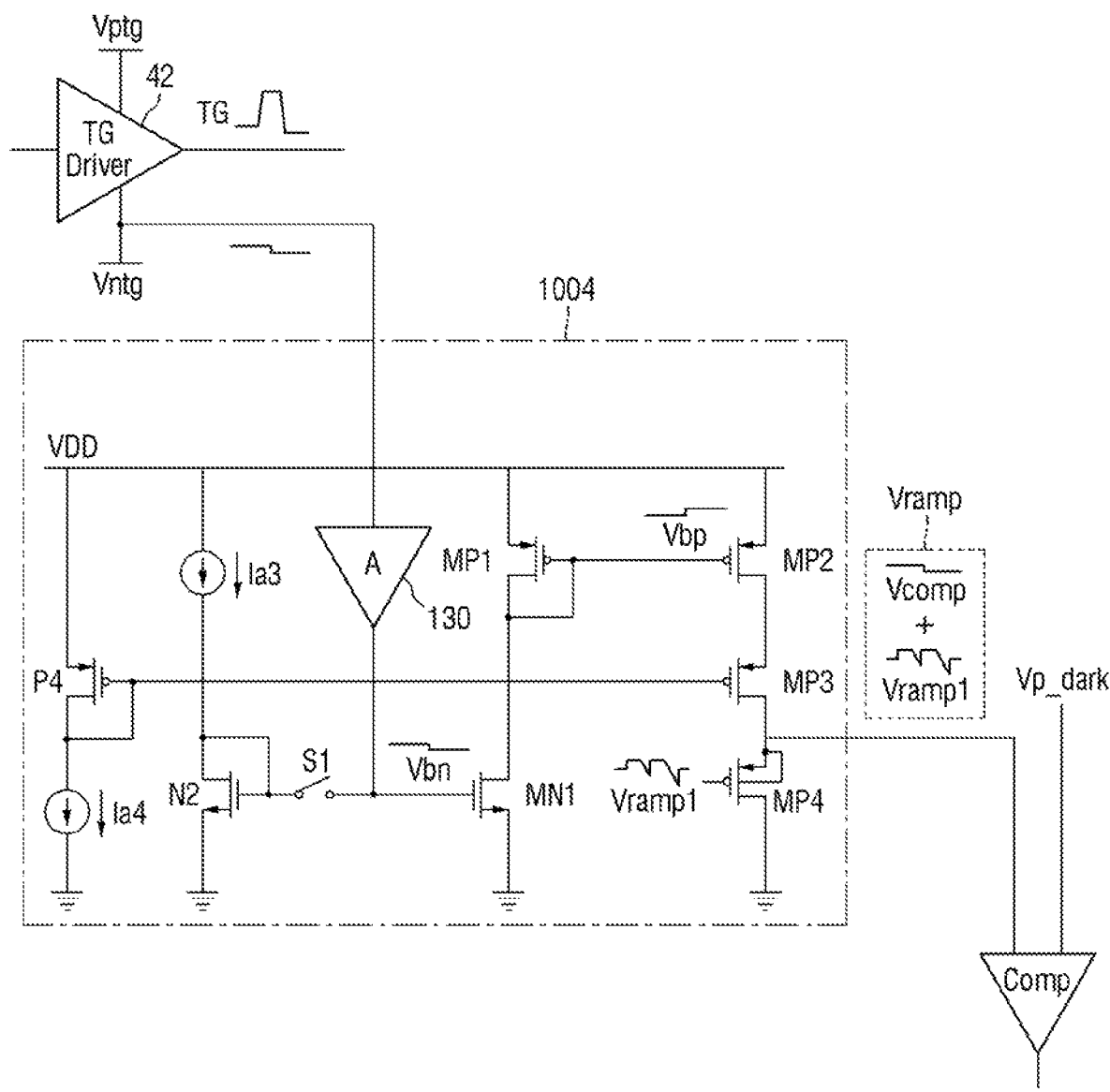
FIG. 16 is a partial equivalent circuit diagram illustrating the structure of an image sensor according to some exemplary embodiments of the present disclosure according to some exemplary embodiments of the present disclosure.

FIG. 16 is a partial equivalent circuit diagram illustrating the structure of an image sensor according to some exemplary embodiments of the present disclosure.

Referring to FIG. 16, the image sensor according to some exemplary embodiments of the present disclosure may include a fifth compensation module 1004.

The fifth compensation module 1004 may include a fourth bias PMOS MP4. The fourth bias PMOS MP4 may receive a first ramp voltage Vramp1 as its gate voltage and may be connected in series to a third bias PMOS MP3. A second bias PMOS MP2 may be connected to the mirror circuit of a first bias PMOS MP1. The gate voltage of the second bias PMOS MP2 may be scaled by the current voltage characteristics of a first bias NMOS MN1 and the first bias PMOS MP1.

In accordance with the voltage current characteristics of the second and fourth bias PMOSs MP2 and MP4, $\Delta Vcomp = \Delta Vbp \times -gmp2/gmp4$.

Accordingly, considering that $\Delta Vbn=\Delta Vntg \times A$ and $\Delta Vbp=\Delta Vbn \times -gmn1/gmp1$, $\Delta Vcomp=\Delta Vntg \times A \times -gmp1/gmp1 \times -gmp2/gmp4$.

An image sensor according to some exemplary embodiments of the present disclosure will hereinafter be described with reference to FIG. 17, and any redundant descriptions of the image sensors of FIGS. 5, 9 through 11, 12, 13, 14, 15, and 16 will be avoided.

Figure 17:
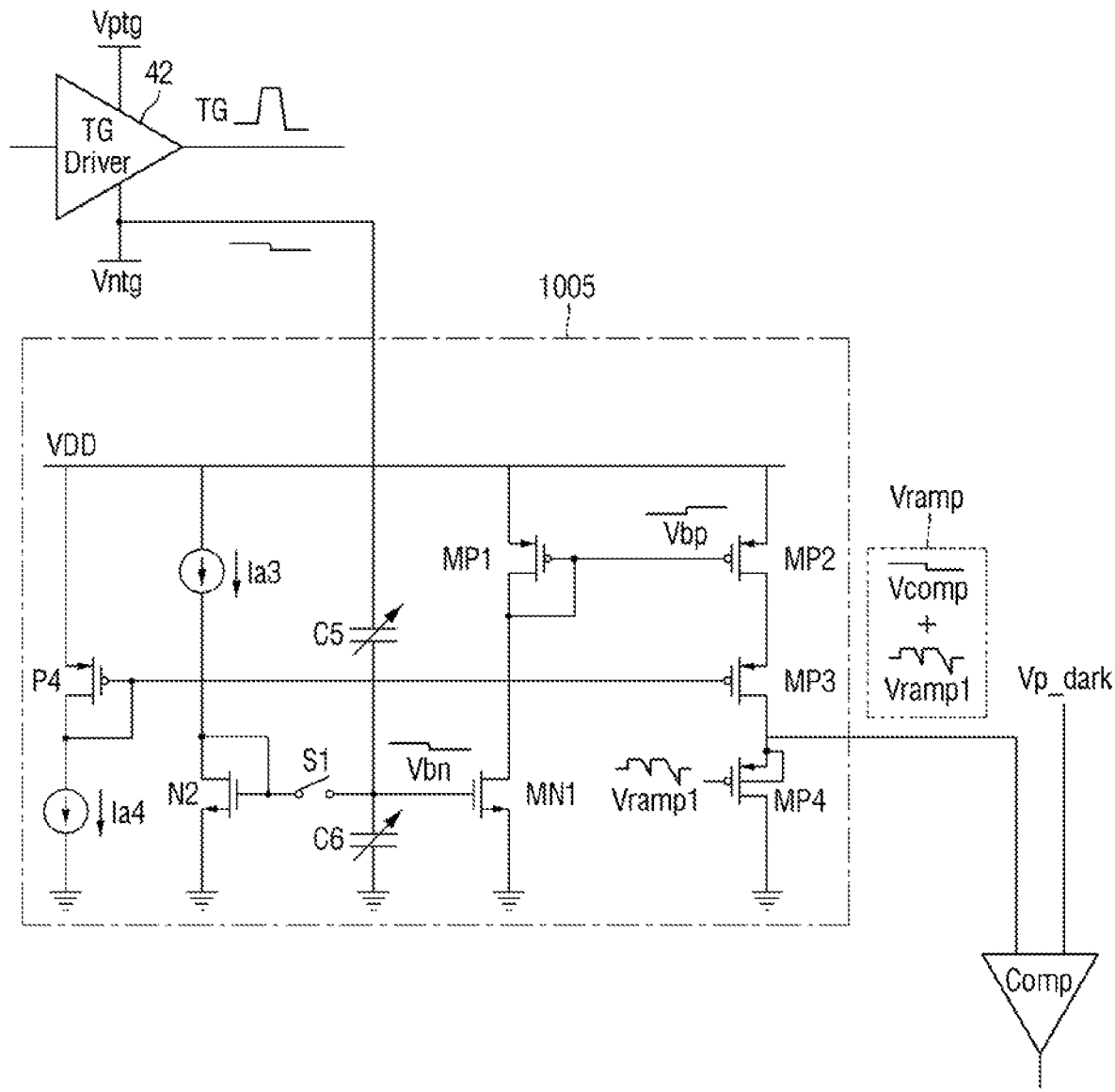
FIG. 17 is a partial equivalent circuit diagram illustrating the structure of an image sensor according to some exemplary embodiments of the present disclosure according to some exemplary embodiments of the present disclosure.

FIG. 17 is a partial equivalent circuit diagram illustrating the structure of an image sensor according to some exemplary embodiments of the present disclosure.

Referring to FIG. 17, the image sensor according to some exemplary embodiments of the present disclosure may include a sixth compensation module 1005.

The sixth compensation module 1005 may include fifth and sixth variable capacitors C5 and C6, instead of a non-inverting amplifier 130 of FIG. 16.

Accordingly, a compensation voltage Vcomp may be represented by the following equation: $\Delta Vcomp=\Delta Vntg \times C5/(C5+C6) \times -gmn1/gmp1 \times gmp2/gmp4$.

Here, C5 denotes the capacitance of the fifth variable capacitor C5, and C6 denotes the capacitance of the sixth variable capacitor C6.

The sixth variable capacitor C6 of the sixth compensation module 1005 may perform the same functions as the first sampling circuit 210 of FIGS. 9 and 10 or the second sampling circuit 211 of FIG. 11. Thus, in the sixth variable capacitor C6, like in the second sampling circuit 211 of FIG. 11, multiple capacitors may be provided. In this case, some of the multiple capacitors may be connected to a power supply voltage VDD, and the other capacitor(s) may be grounded.

As described above, according to some exemplary embodiments of the present disclosure, a compensation module is provided to generate a ramp voltage that is proportional to a sum of an uncompensated ramp signal and a compensation signal. An output module is provided to output a digital code based on comparing the ramp voltage and the signal voltage. Here, the compensation signal is generated based on scaling from a variation signal induced by a variation in a voltage on the conducting line in the first array for receiving the transfer gate signal. In some embodiments, referring to FIG. 5, the induced variation signal may be the second interval d2 in the second voltage Vntg, and the compensation signal may be scaled from this second interval d2 in the second voltage Vntg. In other embodiments, the induced variation signal may be other signal change induced by the variation in the transfer gate signal TG. Generally, the induced variation signal may be induced by a variation in the voltage on a conducting line for receiving the transfer gate signal.

In some embodiments, the compensation module may include a current source (e.g., Iramp in FIGS. 13-15) outputting a ramp current as the uncompensated ramp signal, and a first transistor (e.g., MP1 in FIG. 13 or MP2 in FIGS. 14-17) generating a compensation current in its semiconductor channel as the compensation signal. In some embodiments, the compensation module may include a resistor (e.g., Rramp in FIGS. 13-15) receiving the ramp current and the compensation current to generate the ramp voltage.

In some embodiments, the compensation module may include a second transistor (e.g., MP2 in FIG. 13 or MP3 in FIGS. 14-17) having its semiconductor channel connected to the semiconductor channel of the first transistor. In some embodiments, the compensation module may include a third transistor (e.g., MP1 in FIGS. 14-17) having its gate connected to the gate of the first transistor, and a fourth transistor (e.g., MN1 in FIGS. 14-17) having its semiconductor channel connected to the semiconductor channel of the third transistor.

In some embodiments, the compensation module may include a fifth transistor (e.g., MP4 in FIGS. 16-17), and the semiconductor channel of the second transistor is connected between the semiconductor channel of the first transistor and the semiconductor channel of the fifth transistor. The fifth transistor may have its gate receiving an uncompensated ramp voltage as the uncompensated ramp signal.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An image sensor comprising:
   a pixel array including first and second pixels, the first and second pixels receiving a same transfer gate signal and outputting first and second signal voltages, respectively;
   a transfer gate driver receiving first and second voltages and generating the transfer gate signal, the transfer gate signal having the first voltage as its maximum voltage, having the second voltage as its minimum voltage and applying the transfer gate signal to a charge transfer transistor of each of the pixels; and
   a first circuit detecting a variation in the second voltage, generating a compensation voltage based on the variation in the second voltage, and performing a compensation operation that adds the compensation voltage to the first and second signal voltages, respectively.

2. The image sensor of claim 1, further comprising: a second circuit generating a ramp voltage, wherein the compensation operation adds the ramp voltage to the first and second signal voltages, respectively.

3. The image sensor of claim 2, wherein the first circuit generates the compensation voltage by inverting the variation in the second voltage.

4. The image sensor of claim 2, wherein the first circuit adds the compensation voltage to the ramp voltage.

5. The image sensor of claim 4, wherein the first circuit generates the compensation voltage by not inverting the variation in the second voltage.

6. The image sensor of claim 2, further comprising:
   a comparator comparing each of the first and second signal voltages with the ramp voltage and outputting first and second comparison signals.

7. The image sensor of claim 6, wherein the first comparison signal is a digital value corresponding to a result of comparing a magnitude of the first signal voltage and a magnitude of the ramp voltage, the second comparison signal is a digital value corresponding to a result of comparing a magnitude of the second signal voltage and a magnitude of the ramp voltage.

8. The image sensor of claim 7, further comprising:
   a counter counting the first and second comparison signals and outputting first and second digital codes.

9. The image sensor of claim 8, wherein the first and second digital codes include illuminance information of light applied to the first and second pixels.

10. The image sensor of claim 8,
    wherein the first digital code indicates the first pixel is saturated with light having a maximum unit of illuminance, and the second digital code indicates the second pixel is saturated with light having a unit of illuminance lower than the maximum unit.

11. An image sensor comprising:
a pixel array including first and second pixels that belong to a same row, the first and second pixels outputting first and second signal voltages, respectively; a bias circuit connected to the pixel array;
a transfer gate driver generating a transfer gate signal based on first and second voltages and providing the transfer gate signal to the first and second pixels, the transfer gate signal having the first voltage as its maximum voltage, having the second voltage as its minimum voltage and applying the transfer gate signal to a charge transfer transistor of each of the pixels, respectively;
a first circuit generating a ramp voltage;
a second circuit generating a compensation voltage in accordance with a variation in the second voltage and performing a compensation operation that adds the compensation voltage to the first and second voltages or to the ramp voltage; and
a third circuit generating a first digital code based on the ramp voltage and the first signal voltage and generating a second digital code based on the ramp voltage and the second signal voltage.

12. The image sensor of claim 11, wherein the second circuit is connected to one of the bias circuit or the first circuit.

13. The image sensor of claim 12, wherein
the second circuit is connected to the bias circuit, and
the compensation voltage is generated by inverting the variation in the second voltage.

14. The image sensor of claim 12, wherein
the second circuit is connected to the first circuit, and
the compensation voltage is generated by not inverting the variation in the second voltage.

15. The image sensor of claim 14, further comprising:
a ramp buffer provided between the second circuit and the third circuit.

16. The image sensor of claim 12, wherein the third circuit includes a comparator, which compares each of the first and second signal voltages with the ramp voltage and outputs first and second comparison signals, and a counter counting number of cycles in a clock signal during a time duration of each of the first and second comparison signals.

17. An image sensor comprising:
a photoelectric element accumulating charges therein by absorbing incident light;
a transfer transistor transferring the charges to a floating diffusion region in response to a transfer gate signal;
a source follower outputting a voltage of the floating diffusion region as a signal voltage;
a transfer gate driver applying the transfer gate signal to the transfer transistor;
a first circuit generating a ramp voltage;
a second circuit generating a compensation voltage by detecting a variation in the transfer gate signal, and performing a compensation operation that adds the compensation voltage to the ramp voltage or the signal voltage; and
a third circuit comparing the ramp voltage with a sum of the signal voltage and the compensation voltage or comparing the signal voltage with a sum of the ramp voltage and the compensation voltage, and the third circuit outputting a digital code.

18. The image sensor of claim 17, wherein the second circuit generates the compensation voltage by scaling the variation in the transfer gate signal.

* * * * *